(12) United States Patent
Farrell et al.

(10) Patent No.: US 9,378,790 B2
(45) Date of Patent: Jun. 28, 2016

(54) APPARATUS AND METHOD FOR BUFFERED WRITE COMMANDS IN A MEMORY

(75) Inventors: Todd D. Farrell, Boise, ID (US); Jeffrey P. Wright, Boise, ID (US); Victor Wong, Boise, ID (US); Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 277 days.

(21) Appl. No.: 13/565,583

(22) Filed: Aug. 2, 2012

(65) Prior Publication Data

US 2012/0324179 A1 Dec. 20, 2012

Related U.S. Application Data

(63) Continuation of application No. 12/410,288, filed on Mar. 24, 2009, now Pat. No. 8,250,328.

(51) Int. Cl.
*G06F 12/00* (2006.01)
*G11C 7/22* (2006.01)
*G06F 13/16* (2006.01)

(52) U.S. Cl.
CPC ............... *G11C 7/22* (2013.01); *G06F 13/161* (2013.01); *G11C 2207/2218* (2013.01)

(58) Field of Classification Search
CPC  G06F 13/1621; G06F 13/1626; G06F 13/161
USPC .......................... 711/137, 118, 155, E12.001
See application file for complete search history.

(56) References Cited

U.S. PATENT DOCUMENTS

| | | | |
|---|---|---|---|
| 5,287,469 A * | 2/1994 | Tsuboi ........................... | 711/103 |
| 5,673,415 A * | 9/1997 | Nguyen et al. ................. | 711/149 |
| 5,696,938 A | 12/1997 | Cassetti et al. | |
| 6,647,470 B1 | 11/2003 | Janzen | |
| 6,880,056 B2 | 4/2005 | Kootstra | |
| 6,938,142 B2 | 8/2005 | Pawlowski | |
| 7,107,415 B2 | 9/2006 | Jeddeloh et al. | |
| 7,533,217 B2 * | 5/2009 | Hayasaka ....................... | 711/112 |
| 7,562,180 B2 * | 7/2009 | Gyl et al. ........................ | 711/103 |
| 7,788,451 B2 | 8/2010 | Larson et al. | |
| 2006/0123191 A1* | 6/2006 | Hayasaka ....................... | 711/113 |
| 2010/0250874 A1 | 9/2010 | Farrell et al. | |

* cited by examiner

*Primary Examiner* — Pierre-Michel Bataille
(74) *Attorney, Agent, or Firm* — Dorsey & Whitney LLP

(57) ABSTRACT

Memories, buffered write command circuits, and methods for executing memory commands in a memory. In some embodiments, read commands that are received after write commands are executed internally prior to executing the earlier received write commands. Write commands are buffered so that the commands can be executed upon completion of the later received read command. One example of a buffered write command circuit includes a write command buffer to buffer write commands and propagate buffered write commands therethrough in response to a clock signal and further includes write command buffer logic. The write command buffer logic generates an active clock signal to propagate the buffered write commands through the write command buffer for execution, suspends the active clock signal in response to receiving a read command after the write command is received, and restarts the active clock upon completion of the later received read command.

16 Claims, 4 Drawing Sheets

APPARATUS AND METHOD FOR BUFFERED WRITE COMMANDS IN A MEMORY

CROSS-REFERENCE TO RELATED APPLICATION

This application is a continuation of U.S. patent application Ser. No. 12/410,288, filed Mar. 24, 2009 and issued as U.S. Pat. No. 8,250,328 on Aug. 21, 2012. This application and patent are incorporated by reference herein in their entirety and for all purposes.

TECHNICAL FIELD

Embodiments of the invention relate generally to semiconductor memory, and more specifically, to memories buffering memory commands to improve memory command scheduling.

BACKGROUND OF THE INVENTION

The timing of issuing memory commands to a memory device are governed by timing specifications, which provide sufficient timing margin for proper operation of the memory device. For example, a common timing specification is the minimum time between issuing consecutive memory access commands, such as consecutive write commands or consecutive read commands. The minimum time provides sufficient time for the previous memory access command to complete before executing the subsequent memory access command. Another common timing specification is the minimum time after issuing a write command before a read command can be issued. The minimum time allows the write operation to fully complete before internally beginning the read operation. Typically, the minimum time between consecutive similar memory access commands (e.g., two clock cycles) is significantly less than the minimum time between a write command followed by a read command (e.g., 15 clock cycles).

In a memory system having many memory devices (which may be separated into memory groups, such as banks of memory), tracking and issuing write-read command combinations to the memory according to the appropriate timing can be very complicated. A memory controller must be capable of managing sequences of commands for each of the memory devices (or banks) while ensuring that the time at which the individual commands are issued to each of the memory devices comply with timing specifications. Where operation of the memory is interleaved to improve memory access times, for example, issuing a write command to a first memory group, then issuing a write command to a second memory group, and then to a third memory group during the minimum time between write and read commands for the first group, and then issuing the read command to the first group, then the second group, and then the third group, the memory controller must track the sequence of commands for each of the groups while weaving the individual commands together all the while maintaining the correct timing.

A concept of "additive latency" (AL) has been introduced for the operation of memory system to make command and data busses efficient for sustainable bandwidths. With additive latency commands may be issued to memory externally, but held by the memory device internally prior to execution for the duration of AL in order to improve system scheduling. In particular, including AL can help avoid collision on the command bus and gaps in data input/output bursts.

Taking advantage of AL can reduce some of the timing complexities of managing the multi-group memory system by providing flexibility in scheduling commands. Nevertheless, in managing the issue of issuing complex sequences of memory access commands with the appropriate timing, timing gaps between the commands of a sequence of commands or between data can result. Although timing specifications are met, utilization of the command and data busses may be compromised.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the invention include buffered write circuitry for reordering write operations, for example, interrupting normal internal write operations of an earlier received write command to allow an internal read operation of a later received read command to be executed and completed before completing the write operation.

Figure 1:
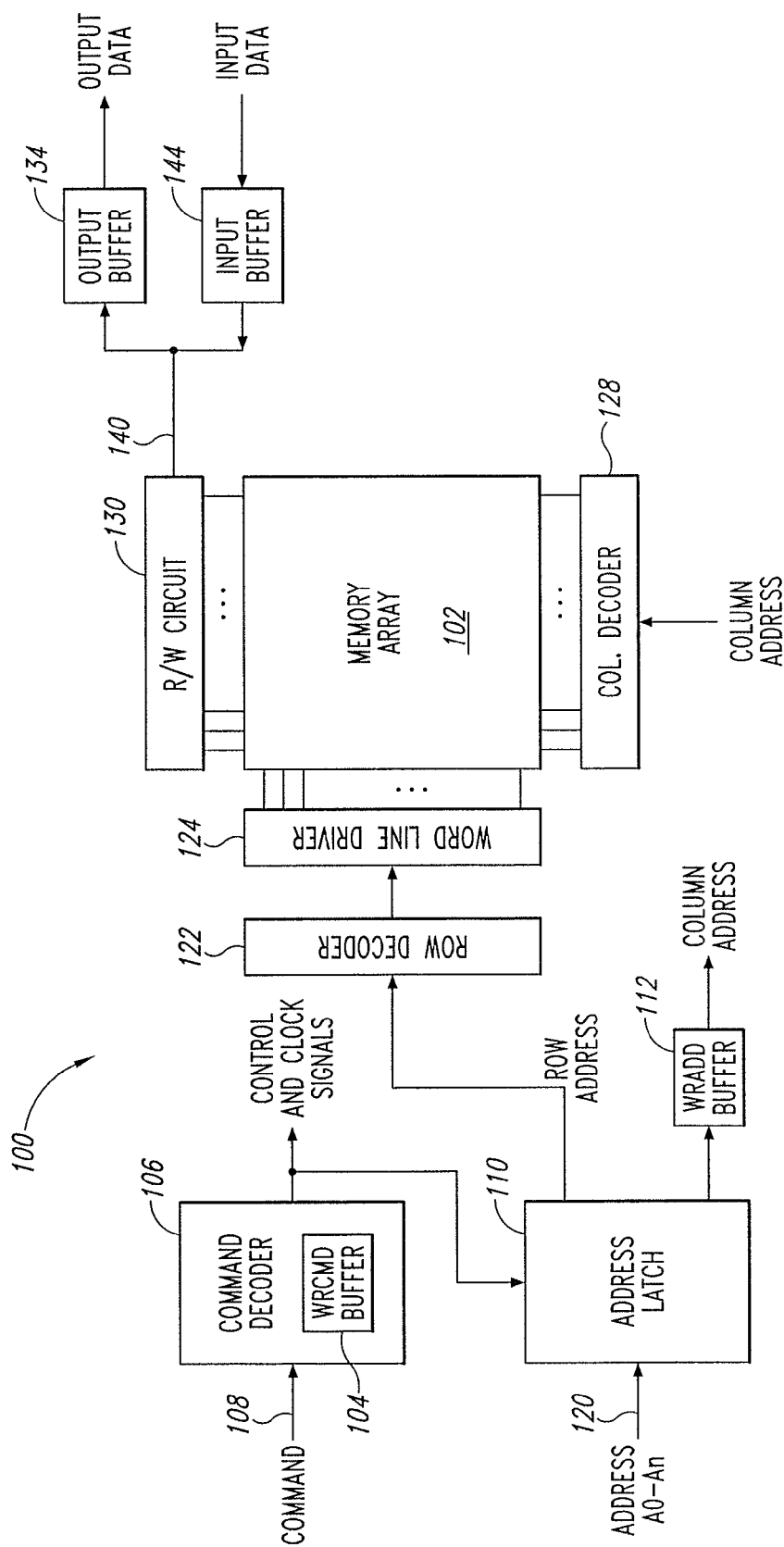
FIG. 1 is a block diagram of a memory according to an embodiment of the invention.

FIG. 1 illustrates a memory 100 according to some embodiments of the invention. The memory 100 buffers write commands, address, and data to allow later received read commands to be executed internally before earlier received write commands. The memory 100 includes an array 102 of memory cells, which may be, for example, DRAM memory cells, SRAM memory cells, flash memory cells, or some other types of memory cells. The memory 100 includes a command decoder 106 that receives memory commands through a command bus 108 and generates internal control and clock signals within the memory 100 to carry out various memory operations. For example, the command decoder 106 is used to generate internal control signals to read data from and write data to the memory array 102 in response to read and write commands. The command decoder 106 includes a write command buffer 104 according to an embodiment of the invention to buffer write commands. As will be explained in more detail below, the write command buffer 104 buffers write commands so that read commands later received by the memory 100 can be internally executed and completed before executing the buffered write commands. Row and column address signals are applied to the memory 100 through an address bus 120 and provided to an address latch 110. The address latch then outputs a separate column address and a separate row address. The row addresses are provided by the address latch 110 to a row address decoder 122. The column addresses are provided to a write address buffer 112 according to an embodiment of the invention to be buffered until provided to a column decoder 128. As will be explained in more detail below, the buffered column addresses are associated with respective write commands buffered by the write command buffer 104.

The column address decoder 128 selects bit lines extending through the array 102 corresponding to respective column addresses. The row address decoder 122 is connected to word line driver 124 that activates respective rows of memory cells in the array 102 corresponding to received row addresses. The selected data line (e.g., a bit line or bit lines) corresponding to a received column address are coupled to a read/write circuitry 130 to provide read data to a data output buffer 134 via an input-output data bus 140. Write data are applied to the memory array 102 through a data input buffer 144 and the memory array read/write circuitry 130. The data input buffer 144 buffers write data associated with respective write commands buffered in the write command buffer 104 until provided to the read/write circuitry 130 to be written to the memory array 102.

Figure 2:
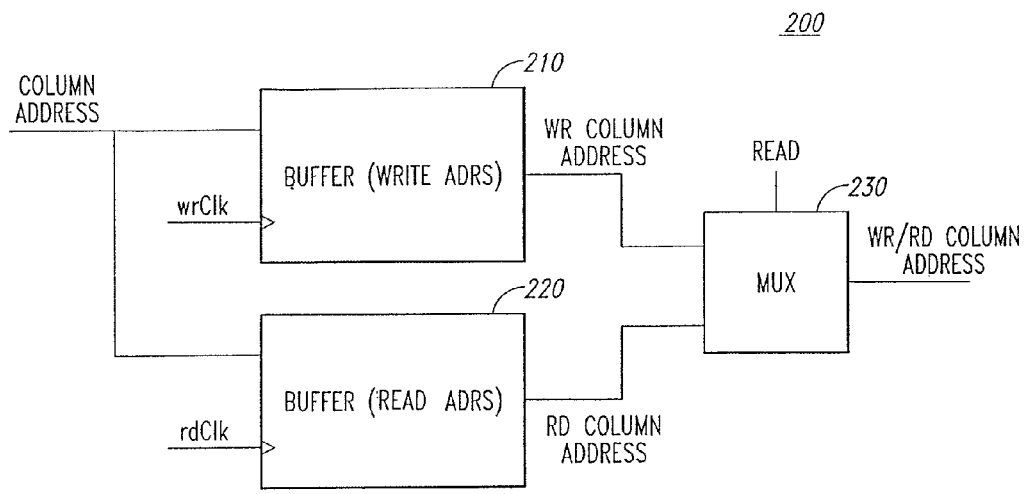
FIG. 2 is a block diagram of a column address buffer according to some embodiments of the invention.

FIG. 2 illustrates a column address buffer 200 according to some embodiments of the invention. The column address buffer can be used as the write address buffer 112 of the memory 100 shown in FIG. 1. The column address buffer 200 is coupled to the address latch 110 (FIG. 1) to receive column addresses and further coupled to the command decoder to receive read and write clock signals rdClk and wrClk. The column address buffer 200 includes a write column address buffer 210 for latching and buffering column addresses provided by the address latch 110 in response to the wrClk signal. A read column address buffer 220 latches the column addresses in response to the rdClk signal. A multiplexer 230 is coupled to the write and read column address buffers 230 and selectively couples the write column addresses or the read column addresses under the control of a read signal Read, which is indicative of executing a read command. In some embodiments, the write and read column address buffers 210, 220 are implemented as first-in-first-out (FIFO) buffers that latch an address and further provide an earlier latched address signal to the multiplexer 230 responsive the respective clock signal. In some embodiments, the depth of the write and read column address buffers 210, 220 are different, and in some other embodiments, the depth of the column address buffers 210, 220 are the same.

In operation, the read and write column address buffers 210, 220 are clocked to capture column addresses. In the event a column address provided by the address latch 110 is for a read command, as decoded by the command decoder 106, an active rdClk signal is provided to the read column address buffer 220 to latch the column address as a read column address. In contrast, when a column address from the address latch 110 is for a write command, the column address is latched by the write column address buffer 210 responsive to an active wrClk signal generated by the command decoder 106. Column addresses that are previously latched into the write and read column address buffers 210, 220 are similarly clocked out by the respective wrClk, rdClk signals as well. In this manner, column addresses for multiple write commands can be temporarily stored in the correct order in which the write column addresses were received by the memory while read column addresses for read commands received after a write command are forwarded ahead of the write column addresses. The multiplexer 230 is controlled by the Read signal to provide either the write column addresses or read column addresses to the column decoder 128.

Figure 3:
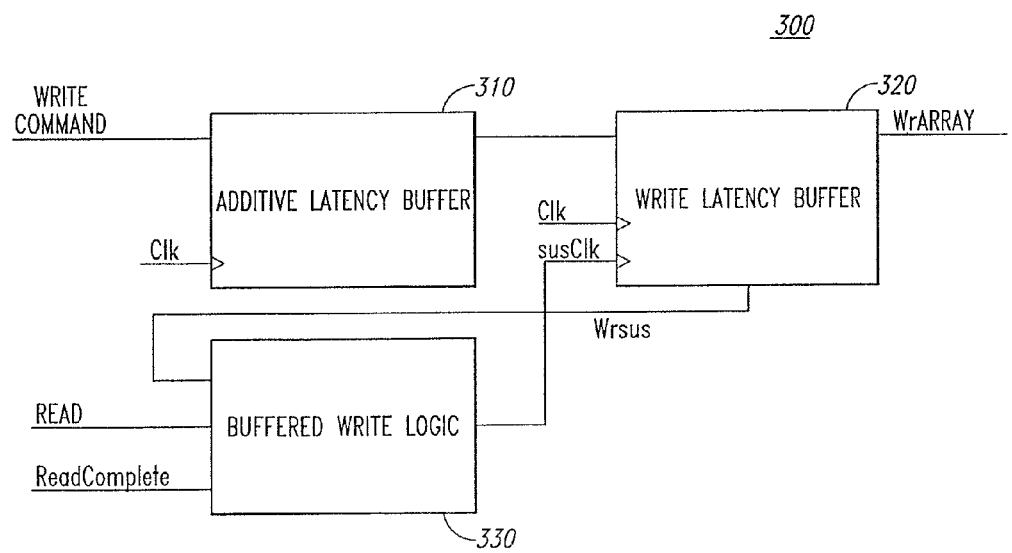
FIG. 3 is a block diagram of a write command buffer and logic according to some embodiments of the invention.

FIG. 3 illustrates a write command buffer and logic 300 according to an embodiment of the present invention. In some embodiments, the write command buffer and logic 300 is included in the command decoder 106. For example, the write command buffer and logic 300 may be included in the command decoder 106 of the memory 100 shown in FIG. 1. The write command buffer and logic 300 includes an additive latency buffer 310 and a write latency buffer 320 in which decoded write commands can be buffered. The additive latency buffer 310 receives decoded write commands and are propagated through the additive latency buffer 310 in response to a clock signal Clk. The additive latency buffer 310 generally delays the decoded write command to provide additive latency. The write latency buffer 320 receives the decoded write commands delayed by the additive latency buffer 310 and propagates the decoded write commands through a first portion of the write latency buffer 320 in response to the Clk signal and through a second portion of the write latency buffer 320 in response to a clock signal susClk output by buffered write logic 330. After a decoded write command is propagated through the additive latency buffer 310 and the write latency buffer 320, the decoded write command is provided as a WrArray command to initiate the write operation in the memory array.

The buffered write logic 330 generates an inactive susClk signal to suspend propagation of the decoded write commands through the second portion of the write latency buffer when a read command has been decoded, as indicated by the read signal provided to the buffered write logic 330, and a decoded write command is present in the second portion of the write latency buffer 320, as indicated by a suspend signal wrsus. The buffered write logic 330 generates an active susClk signal to propagate decoded write commands through the second portion of the write latency buffer 320 when no read command has been received or is pending, as indicated by a read completion signal ReadComplete.

In operation, the write command buffer and logic 300 allow write commands to be buffered while a read command received after receipt of the write commands is executed before the earlier received write commands. Write commands decoded in the command decoder 106 are provided to the additive latency buffer 310 and then to the write latency buffer 320 to provide a delay before the decoded write command is provided as the WrArray command to initiate the write command in the array.

In an example where a decoded write command is provided to the additive latency and write latency buffers 310, 320 and no read commands are decoded by the command decoder 106 while a decoded write command is propagating through the second portion of the write latency buffer 320 or before the decoded write command has propagated all the way through the buffers 310, 320, the decoded write command is output by the write latency buffer 320 as the WrArray command to initiate the write operation in the array. However, in an example where a decoded write command is propagating through the additive latency and write latency buffers 310, 320, and a read command is decoded (as indicated by the Read signal) when the decoded write command has reached the second portion of the write latency buffer 320 (as indicated by the wrsus signal), propagation of that write command is suspended in order to allow execution of the read command to be initiated and completed in the array. Suspension of the decoded write command from propagating all the way through the second portion of the write latency buffer prevents a command collision between the decoded write command and the later received decoded read command that is to be executed before the earlier received write commands. Upon completion of the read operation, propagation of the decoded write command is restarted by an active susClk signal and is eventually provided as the WrArray command to initiate the write operation in the array.

In addition to buffering the write commands, the write addresses corresponding to the buffered write commands are buffered and managed by a column address buffer, such as the column address buffer 200 previously described with reference to FIG. 2, so that the write operation is performed for the correct memory location. Additionally, write data corresponding to the buffered write commands are buffered in an write data buffer (not shown). In some embodiments, the write data buffer is included in the input buffer of the memory device, such as input buffer 144. In some embodiments, the depth of the buffers used for buffering the write commands, write addresses, and the write data are similar so that clocking the buffers in synchronicity maintain the correct correspondence of write command, write address, and write data. In other embodiments, the depths of the buffers are different, and matching the corresponding write commands, write addresses, and write data is managed by providing appropriately timed clock signals to clock the buffers. The buffers for commands, addresses and data can be implemented using conventional designs, for example, FIFO buffers, shift registers, sequential registers, or the like.

Figure 4:
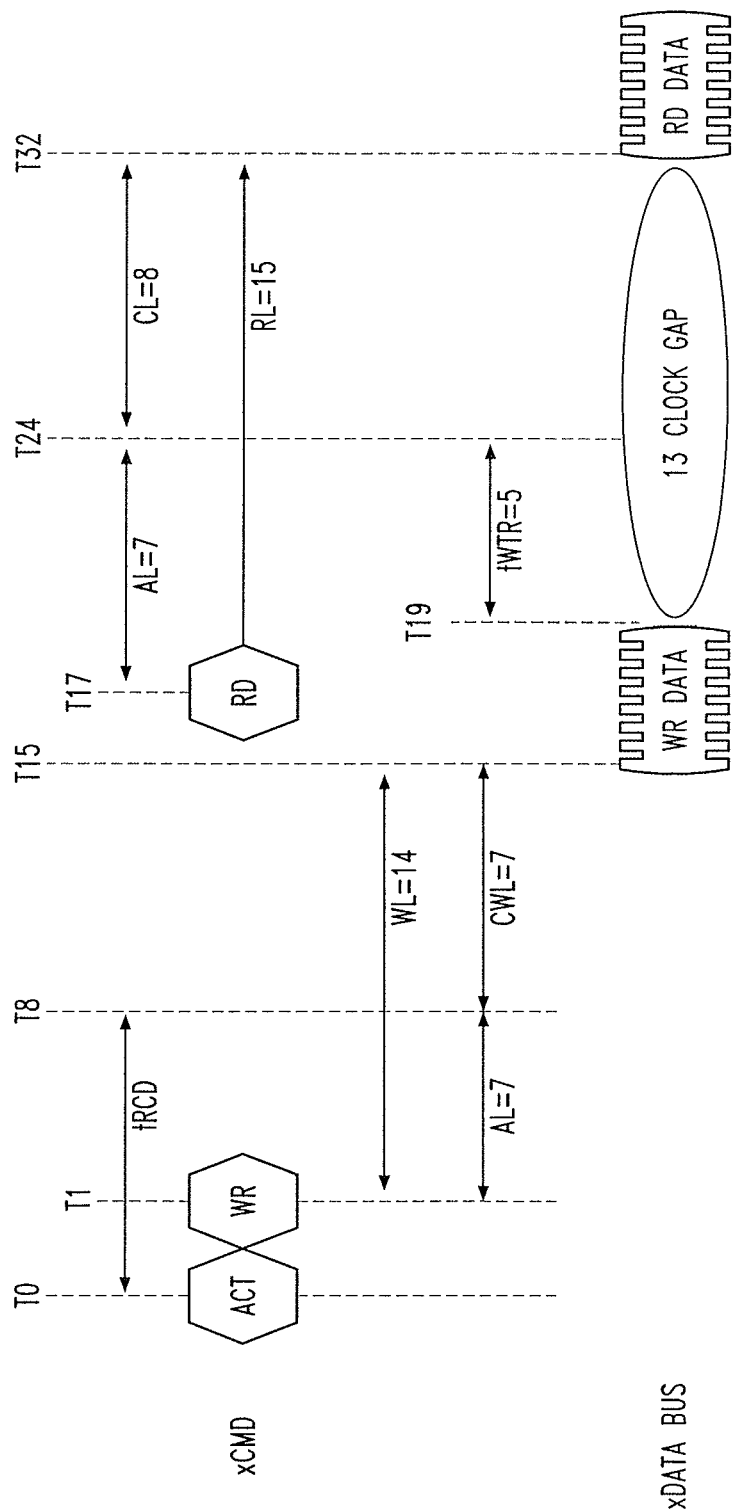
FIG. 4 is a timing diagram for conventional write-to-read timing.

FIG. 4 is a timing diagram illustrating command (xCMD) and data (xDATA) signals for a write operation followed by a read operation according to signal timing for a conventional memory device. The signal timing is based on a burst length (BL) of 8, CAS write latency (CWL) of 7 clock cycles, CAS latency (CL) of 8 clock cycles, and additive latency (AL) of 7 (i.e., CL−1) clock cycles. As known, some of the parameters are set in a mode register in the memory device, for example, BL, CL, CWL, AL, are examples of parameters that are typically set through a mode register. The parameters of the mode register are often set upon initialization of the memory device. At time T0 an activation command ACT is issued to the memory device to activate a bank of memory corresponding to a bank address (not shown). A write command WR is issued to the memory device at the next clock cycle time T1, taking advantage of the AL of 7 that allows commands to be issued earlier than would otherwise be allowed. As previously discussed, the WR command is held internally by the memory device until AL elapses, resulting in the write operation beginning execution at time T8. Write data is provided to the memory device beginning at time T15, which corresponds to CWL=7 after time T8. Again by taking advantage of AL=7, a read command RD is issued to the memory device at time T17, which is held by the memory device until time T24. Issuing a RD command any earlier than at T17 will violate the minimum write-to-read time (tWTR), which is 5 clock cycles in the present example. As illustrated in FIG. 4, however, issuing the RD command at T17 results in read data provided by the memory device at T32, 13 clock cycles after the last of the write data is provided to the memory device. That is, the data bus is under utilized by being left idle for 13 clock cycles.

Figure 5:
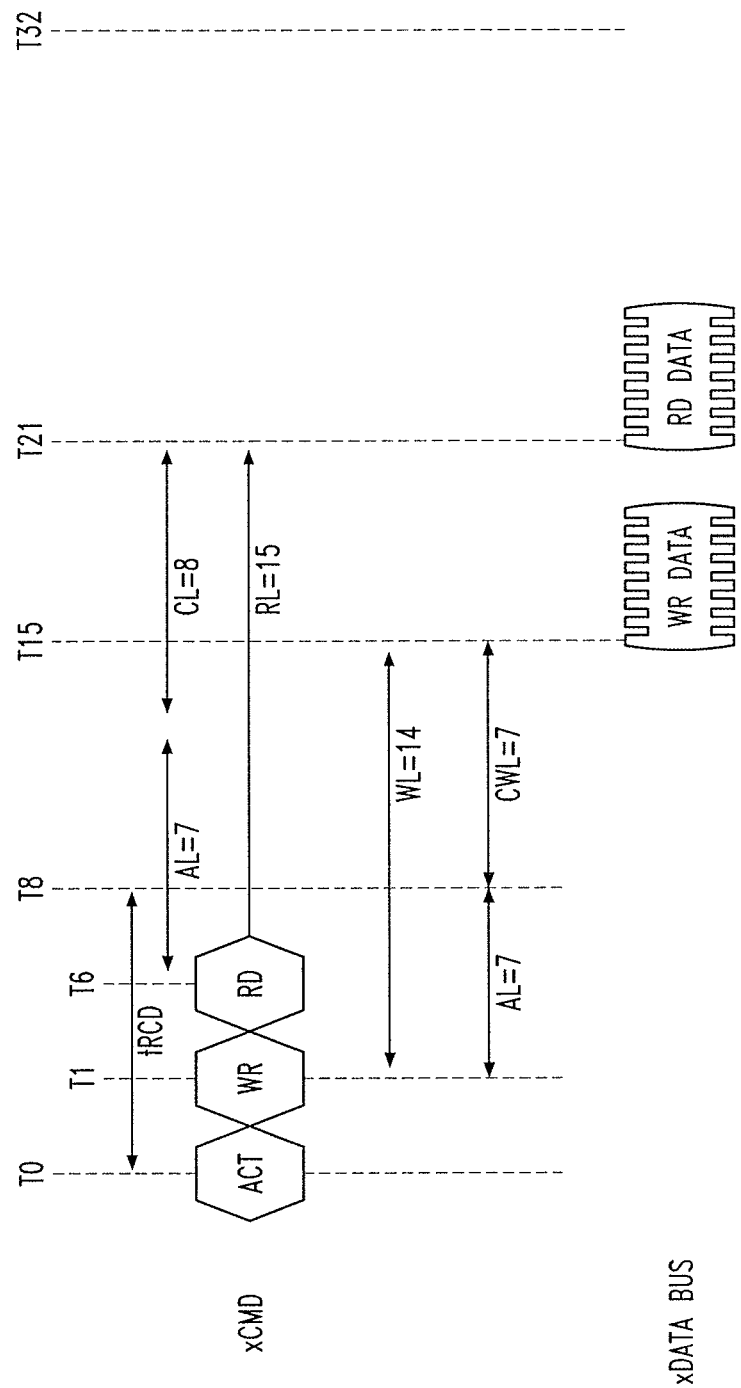
FIG. 5 is a timing diagram for write-to-read timing according to an embodiment of the invention.

FIG. 5 is a timing diagram illustrating command and data signals for a write operation followed by a read operation according to signal timing for a memory device according to an embodiment of the invention. As in FIG. 4, the signal timing is based on a BL of 8, CWL of 7 clock cycles, CL of 8 clock cycles, and AL of 7 clock cycles. As previously discussed, some of the parameters are set in a mode register in the memory device, for example, BL, CL, CWL, AL, are examples of parameters that are typically set through a mode register. At time T0, an ACT command is issued to the memory device to activate a bank of memory corresponding to bank address signals (not shown). At time T1 a WR command is issued to the memory device. Although the WR command will be buffered by the memory device and executed at a later time, the AL allows the WR command to be issued by a memory controller much earlier than otherwise be allowed. Write data corresponding to the WR command issue at T1 is provided to the memory device at time T15, the same relative time as with the conventional signal timing of FIG. 4. As previously discussed, the write data is also buffered until the corresponding WR command is executed.

In contrast to the conventional signal timing shown in FIG. 4, embodiments of the invention allow a RD command issued after a WR command to be issued much sooner. As previously described, a read command issued after a write command can be executed before the write commands by buffering the write command and corresponding write address in a write command buffer and a column address buffer according to embodiments of the invention, such as write command buffer 300 and write address buffer 200, as previously described. As a result, the RD command can be issued much sooner than with conventional signal timing and read data can be received by a memory controller much sooner as well.

In FIG. 5, the RD command is issued to the memory device at time T6, within the AL time and approximately 11 clock cycles earlier than with the conventional signal timing of FIG. 4. Additionally, in comparison to conventional signal timing, read data is provided by the memory device much sooner after the last of the write data is provided to the memory device. In FIG. 5, the read data is provided starting at time T21, approximately 11 clock cycles earlier than with the conventional signal timing of FIG. 4, and reducing the data time gap to approximately 2 clock cycles. The buffered WR command is initiated after completion of the RD command (not shown). Although shown in FIG. 5 as a single write WR command issued at time T1 and a single set of corresponding write data, multiple WR commands (and write data) can be issued and buffered prior to the issuance of a RD command. Moreover, multiple RD commands can be issued after an earlier issued WR command or commands. It will be appreciated by those ordinarily skilled in the art that FIG. 5 illustrates the timing of signals for some embodiments of the invention, and is not intended to limit the invention to any particular embodiment.

Issuing the RD command sooner after the WR command and receiving read data sooner after providing the write data than with conventional timing allows a memory controller to issue the sequence of ACT, WR, and RD commands to the memory device and then move onto managing other memory devices. For example, with conventional signal timing, a memory controller likely would issue the ACT and WR commands to the memory device, then issue commands to other memory devices before issuing the RD command to the first memory device in order to utilize the command time gap (between T1 and T17 in FIG. 4) as well as filling the data time gap (between T19 and T32 in FIG. 4) with data from other memory devices. As a result, the memory controller is required to switch back and forth between the memory devices when issuing commands and receiving data from the memory devices to utilize command and data bandwidth. Where several memory devices are operated in an interleaved manner, switching back and forth between the memory devices may result in very complicated and cumbersome command and data timing. With at least some embodiments of the invention, however, write-to-read command timing can be shortened due to the buffering of write commands which may allow command and data bandwidth to be more fully utilized and reduce complexity of command and data scheduling for memory controllers.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory comprising:
 a write command buffer configured to buffer a write command and propagate the buffered write command through the write command buffer based on a clock signal;
 buffer logic coupled to the write command buffer, the buffer logic configured to suspend the clock signal in response to receiving a read command after receiving the write command, and restart the clock signal after completion of execution of the later received read command; and
 an address buffer configured to receive a first address corresponding to the buffered write command and a second address corresponding to the read command, buffer the first address while the clock signal is suspended, and provide the first address during execution of the buffered write command.

2. The memory of claim 1, wherein the address buffer comprises:
 a write address buffer configured to buffer a write memory address corresponding to the write command;
 a read address buffer configured to buffer a read memory address corresponding to the read command; and
 a multiplexer coupled to the write address buffer and to the read address buffer, the multiplexer configured to selectively provide the write memory address during execution of the write command, and selectively provide the read memory address during execution of the read command.

3. The memory of claim 1, further comprising an input buffer configured to receive write data corresponding to the buffered write command, buffer the write command while the clock signal is suspended, and provide the write data during execution of the buffered write command.

4. The memory of claim 1, wherein the write command buffer comprises an additive latency buffer configured buffer the write command for a time period corresponding to the an additive latency parameter, wherein the additive latency buffer is clocked by a first clock signal.

5. The memory of claim 4, wherein the write command buffer further comprises a write latency buffer configured to receive the buffered write command from the additive latency buffer, the write latency buffer comprising:
 a first portion configured to propagate the buffered write command based on the first clock signal; and
 a second portion configured to propagate the buffered write command based on an active clock signal.

6. The memory of claim 1, further comprising an array of memory cells.

7. The memory of claim 1, further comprising a command decoder configured to decode the write command and the read command.

8. A method comprising:
 receiving a write command at a buffer;
 receiving a read command after receiving the write command;
 suspending, using buffer logic, propagation of the write command through the buffer after receiving the read command;
 executing the read command; and
 resuming, using buffer logic, propagation of the write command through the buffer responsive to completion of execution of the read command;
 wherein the write command is received at a first time, and wherein the read command is received at a second time that is later than the first time, wherein a time period between the first time and the second time is less than an additive latency time period.

9. The method of claim 8, further comprising receiving write data corresponding to the write command after receiving the read command.

10. The method of claim 1, wherein suspending propagation of the write command further comprises suspending propagation of the write command during execution of the read command.

11. The method of claim 1, further comprising setting an additive latency time period.

12. The method of claim 8, further comprising providing read data associated with the read command after receiving write data corresponding to the write command.

13. The method of claim 8, further comprising:
 receiving a plurality of consecutive write commands;
 receiving write data corresponding to the plurality of consecutive write commands; and
 providing read data associated with the read command after receiving the write data corresponding to the plurality of write commands.

14. The method of claim 8, further comprising:
 receiving a write address corresponding to the write command;
 buffering the write address;
 buffering the write data for the write command; and
 providing the write address and write data upon initiating execution of the write command following execution of the read command.

15. A method comprising:
 receiving a write command at a memory;
 receiving a read command after receiving the write command;
 suspending, using buffer logic, execution of the write command during execution of the read command, wherein suspending execution of the write command includes:
 buffering the write command in a buffer of the command decoder;
 suspending propagation of the buffered write command through the buffer during execution of the read command; and
 propagating, using buffer logic, the buffered write command through the buffer based on an active clock signal after completion of execution of the read command;
 wherein suspending propagation of the buffered write command comprises suspending a clock corresponding to the active clock signal provided to the buffer.

16. The method of claim 15, further comprising:
 receiving write data associated with the received write commands
 executing the later received read command prior to the received write commands; and
 providing read data associated with the executed read command after receiving the write data.